(12) United States Patent
Anholt et al.

(10) Patent No.: US 9,236,890 B1
(45) Date of Patent: Jan. 12, 2016

(54) DECODING A SUPER-CODE USING JOINT DECODING OF UNDERLYING COMPONENT CODES

(71) Applicant: APPLE INC., Cupertino, CA (US)

(72) Inventors: Micha Anholt, Herzlia Pituach (IL); Moti Teitel, Herzlia Pituach, IL (US); Tomer Ish-Shalom, Herzlia Pituach, IL (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/569,716

(22) Filed: Dec. 14, 2014

(51) Int. Cl.
*H03M 13/00* (2006.01)
*H03M 13/47* (2006.01)
*H03M 13/29* (2006.01)
*H04L 1/00* (2006.01)

(52) U.S. Cl.
CPC .............. *H03M 13/47* (2013.01); *H03M 13/00* (2013.01); *H03M 13/2957* (2013.01); *H04L 1/0057* (2013.01)

(58) Field of Classification Search
CPC . H03M 13/00; H03M 13/2957; H04L 1/0057
USPC ...................... 341/94; 714/776, 755, 780, 786
See application file for complete search history.

(56) References Cited

U.S. PATENT DOCUMENTS

| | | | |
|---|---|---|---|
| 3,811,108 A | 5/1974 | Howell | |
| 4,754,458 A | 6/1988 | Dornstetter | |
| 5,157,671 A | 10/1992 | Karplus | |
| 5,329,535 A | 7/1994 | Coker | |
| 8,700,970 B2 | 4/2014 | Steiner et al. | |
| 2004/0019842 A1 | 1/2004 | Argon et al. | |
| 2008/0172593 A1* | 7/2008 | Rainish | H04N 19/89 714/776 |
| 2010/0253555 A1 | 10/2010 | Weingarten et al. | |
| 2012/0144261 A1 | 6/2012 | Hong et al. | |
| 2014/0059403 A1 | 2/2014 | Sommer et al. | |
| 2014/0129896 A1 | 5/2014 | Parthasarathy et al. | |

FOREIGN PATENT DOCUMENTS

CN 101409565 A 4/2009

OTHER PUBLICATIONS

Bracken et al., "Triple-error-correcting BCH-like codes," IEEE International Symposium on Information Theory, pp. 1723-1725, Jun. 28-Jul. 3, 2009.

MacWilliams et al., "The Theory of Error 10 Correcting Codes," North-Holland Publishing Company, vol. 16, chapters 9.6 and 12.9, pp. 270-277 and 365-368, year 1977.

ITU-T Recommendations G.975.1, "Series G: Transmission Systems and Media, Digital Systems and Networks, Digital sections and digital line system—Optical fibre submarine cable systems; Forward error correction for high bit-rate DWDM submarine systems", Section 1.9.2.1, Feb. 2004.

* cited by examiner

*Primary Examiner* — Joseph Lauture
(74) *Attorney, Agent, or Firm* — D. Kligler I.P. Services Ltd.

(57) ABSTRACT

A method for decoding includes receiving channel inputs for respective bits of a super code word that includes at least first and second component code words having a shared group of bits. At least the first and second component code words are iteratively decoded, and, in response to recognizing that the first and second component code words contain errors only within the shared group of bits, the first and second component code words are jointly decoded.

20 Claims, 4 Drawing Sheets

DECODING A SUPER-CODE USING JOINT DECODING OF UNDERLYING COMPONENT CODES

TECHNICAL FIELD

Embodiments described herein relate generally to Error Correcting Coding (ECC), and particularly to methods and systems for ECC decoding.

BACKGROUND

Various decoding schemes for Error Correction Codes (ECCs) apply iterative decoding of two or more underlying component codes. For example, U.S. Pat. No. 8,700,970, whose disclosure is incorporated herein by reference, describes a system and method for decoding data. Multi-dimensional encoded data may be received that potentially has errors. The multi-dimensional encoded data may encode each input bit in a set of input bits multiple times in multiple different dimensions to generate encoded bits. The encoded bits may be decoded in at least one of the multiple dimensions. If one or more errors are detected in a plurality of encoded bits in at least one of the multiple dimensions, an intersection sub-set of the encoded data may be decoded that includes data encoding the same input bits encoded by the plurality of encoded bits in at least a second dimension of the multiple dimensions. The values of the input bits by decoding the intersection sub-set may be changed.

As another example, U.S. Patent Application Publication 2014/0129896, whose disclosure is incorporated herein by reference, describes apparatuses and methods for error correcting data. A first Error Correction Code (ECC) decoder is configured to decode a first code word to provide a first result and to decode a second code word to provide a second result. The decoder is configured to run up to a particular number of iterations to provide each of the results. A second ECC decoder is configured to decode a third code word to provide decoded data, wherein the third code word comprises the first result and the second result. An evaluation module is configured to initiate a recovery scheme responsive to the decoded data including an error.

SUMMARY

An embodiment that is described herein provides a method for decoding, including receiving channel inputs for respective bits of a super code word that includes at least first and second component code words having a shared group of bits. The at least first and second component code words are iteratively decoded, and, in response to recognizing that the first and second component code words contain errors only within the shared group of bits, the first and second component code words are jointly decoded.

In some embodiments, jointly decoding the first and second component code words includes decoding the first component code word using one or more of the channel inputs of respective bits of the second component code word that are outside the shared group of bits. In other embodiments, jointly decoding the first and second component code words includes decoding the second component code word independently of a successful decoding outcome of decoding the first component code word.

In yet other embodiments, iteratively decoding the first and second component code words includes correcting up to first and second numbers of bit errors in the channel inputs for the respective first and second component code words, and jointly decoding the first and second component code words includes correcting up to a number of errors that is larger than the first and second numbers individually.

In an embodiment, jointly decoding the first and second component code words includes evaluating first and second syndrome sets for decoding the respective first and second component code words, and deriving an error pattern using a syndrome set that includes at least one syndrome from each of the first and second syndrome sets. In another embodiment, the first and second component code words were produced using respective first and second generator polynomials having roots in a given Galois Field (GF), the first and second syndrome sets correspond to first and second sets of roots of the respective first and second generator polynomials, such that a union of the first and second sets of roots includes a sequence of consecutive powers of a primitive element of the given GF. In yet another embodiment, one or more of the roots of the second generator polynomial comprises a reciprocal of a respective root of the first generator polynomial.

In some embodiments, evaluating the second syndrome set includes reversing a bit order of the channel inputs for the respective bits of the second component code word. In other embodiments, the errors contained only within the shared group of bits include a burst error pattern, and jointly decoding the first and second component code words includes jointly encoding redundancy bits for the respective first and second component code words, and replacing bits in the first and second component code words corresponding to the burst error pattern with the jointly encoded redundancy bits. In yet other embodiments, jointly encoding the redundancy bits includes multiplying a vector that includes non-redundancy bits of the first and second component code words by a matrix that is derived from a parity check matrix of the super-code.

In an embodiment, jointly encoding the redundancy bits includes evaluating a joint set of syndromes that includes at least one syndrome corresponding to each of the first and second code words, multiplying each of the evaluated syndromes by a respective power of a primitive element of an underlying GF, and evaluating a position of an error burst within the shared group of bits based on the joint set of syndromes.

In another embodiment, jointly encoding the redundancy bits includes cyclically shifting the shared group of bits within each of the first and second component code words so as to align positions of the shared group of bits in the first and second component code words, evaluating a joint set of syndromes that includes at least one syndrome corresponding to each of the first and second code words, and evaluating a position of an error burst within the shared group of bits based on the joint set of syndromes.

In some embodiments, jointly encoding the redundancy bits includes cyclically shifting the error burst from the evaluated position to a position of respective redundancy bits of the first and second code words, jointly re-encoding the first and second code words, and cyclically shifting the re-encoded bits in the first and second code words to their original respective positions. In other embodiments, jointly decoding the component code words includes evaluating a joint set of syndromes that includes at least one syndrome corresponding to each of the first and second code words, and evaluating an error pattern using the joint syndrome set.

There is additionally provided, in accordance with an embodiment that is described herein, a decoder including an interface and decoding circuitry. The interface is configured to receive channel inputs for respective bits of a super code word that includes at least first and second component code words having a shared group of bits. The decoding circuitry is configured to process the channel inputs so as to iteratively decode the first and second component code words, and, in response to recognizing that the first and second component code words contain errors only within the shared group of bits, to jointly decode the first and second component code words.

These and other embodiment will be more fully understood from the following detailed description of the embodiments thereof, taken together with the drawings in which:

DETAILED DESCRIPTION OF EMBODIMENTS

Overview

Various Error Correcting Codes (ECCs) comprise multiple sub-codes or component codes. Such an ECC is referred to herein as a "super-code". Examples of super codes include Turbo Block Codes (TBC), Turbo Product Codes (TPC) and Generalized Low Density Parity check Code (GLDPC). Encoding a super-code produces super code words that comprise multiple component code words, each encoded using one of the underlying component codes. The component code words, which are typically much shorter than the super code word, may be encoded using any suitable algebraic code, such as, for example, Bose-Chaudhuri-Hocquenghem (BCH) codes and Reed-Solomon (RS) codes. Alternatively, the component code words may be encoded using any suitable non-algebraic codes or small-sized super codes.

Super-codes are typically designed so that each of the component code words shares one or more bits with at least one other component code word. Thus, each bit of the super code word either belongs to a single component code word or is shared among multiple component code words. A valid super code word comprises valid component code words of the underlying component codes.

Embodiments that are described herein provide improved methods and systems for super-code decoding. In some embodiments, decoding a super-code comprises iteratively decoding the individual component code words using respective component decoders. Decoding multiple component code words that are encoded in accordance with the same type of component code can be done using one or more instances of a respective component decoder.

The overall decoding of the super-code succeeds when all of the component codes produce valid respective component code words. Since each component code word shares one or more bits with at least one other component code word, correcting an erroneous bit in one component code word can assist in the decoding of other component code words that share this bit.

A decoder of a super code is also referred to herein as a "super-code decoder," or simply a "super decoder," for brevity. In some embodiments, the super decoder recognizes a state in which one or more erroneous bits occur only within a group of bits that are shared among two or more component code words. The other bits of these code words are all error free, e.g., because these bits were previously corrected by one or more component decoders. Such a scenario may occur, for example, in certain types of a trapping set scenario. In response to recognizing this scenario, the super decoder jointly decodes at least two of the component code words involved. The error pattern corresponding to the erroneous shared bits is also referred to herein as a "joint error pattern".

Unlike iterative decoding, in joint decoding a set of component code words are decoded simultaneously so that decoding one of the code words in the set is independent of previous successful decoding of any other component code word in the set. Moreover, for decoding a given code word, the joint decoder processes inputs that in iterative decoding are used for decoding only other component code words. As will be described below, a decoder based on joint decoding can correct a number of errors that is larger than (e.g., the sum of) the number of error that are correctable by the individual component codes.

In some embodiments, both individual and joint decoding of the component codes are based on syndrome decoding. For example, to individually decode a BCH over $GF(2^m)$ code that is defined by a generator polynomial $g(x)$, the component decoder derives a syndrome set by evaluating its input over a set of roots of $g(x)$. Based on the derived syndromes the decoder then estimates the error pattern for correcting the erroneous input.

In some embodiments, in joint syndrome decoding of two or more component BCH codes, having respective generator polynomials $g1(x)$, $g2(x)$, ..., $gn(x)$, the joint decoder estimates the joint error pattern using the syndromes derived over the roots of two or more of the generator polynomials.

The error correction capability of an ECC may depend on various factors. For example, the guaranteed number of correctable errors in some types of codes that are defined by a respective generator polynomial $g(x)$ depends on the number of roots of $g(x)$ that form a sequence of consecutive powers of a primitive element $\alpha$. Other types of codes can correct multiple errors even though the powers of the respective roots of their generator polynomials are non-sequential. Examples of such codes are described, for example, in "Triple-error-correcting BCH-like codes," IEEE International Symposium on Information Theory, pages 1723-1725, Jun. 28, 2009, which is incorporated herein by reference.

In some embodiments, the (different) individual component codes are designed so that the union set of roots of the respective generator polynomials forms a longer sequence of consecutive powers of $\alpha$ than the sequences of the individual component codes. Joint decoding of such component codes is therefore equivalent to decoding a code that has better error correction capability than (e.g., the sum of) the error correction capabilities of the individual component codes.

In an embodiment, two component codes having respective generator polynomials $g1(x)$ and $g2(x)$ are designed so that the roots of one polynomial are the reciprocals of the roots of the other polynomial. In an embodiment, one or more roots of one polynomial have no corresponding reciprocal root of the other polynomial. Thus, if $\alpha^i$ i=0 ... $\delta$ are the roots of $g1(x)$, $\alpha^{-i}$ are the roots of $g2(x)$. When $\alpha^0$ is a root of both $g1(x)$ and g2(x), this root could be removed from one of these polynomials without degrading the joint decoding performance. The specific roots that are selected for g1(x) and g2(x) participate in determining the properties and error correction capabilities of the composite code.

Given two input code words generated by the respective generator polynomials, individual decoding involves deriving separate syndrome sets over the respective roots and input. As described above, however, when the two code words share the same error pattern, this error pattern can be estimated from a union syndrome set that includes the syndromes of the separate sets. Since for every syndrome in the union syndrome set the union set also comprises a syndrome of the reciprocal root, the union of roots form a sequence of consecutive powers of $\alpha$ that is twice as long as each of the individual sequences corresponding to g1(x) and g2(x). The error correcting capability in this case is therefore doubled.

In some embodiments, deriving the syndromes over a set of roots and over the reciprocal roots is done independently. In other embodiments, the same calculation that is used for deriving the syndromes over the roots of one polynomial is also used for the other generator polynomial by reversing the bit-ordering of the input.

In some embodiments, the super decoder uses joint decoding for high-performance decoding of burst error patterns. Joint decoding of burst error patterns can correct error bursts that are longer than (e.g., the sum of) the lengths of the error bursts that are correctable by each of the individual component codes. In the context of the present patent application and in the claims, the term "burst error pattern of length l" refers to a code word having an l-bit error burst. Such an error burst begins and ends with an erroneous bit, whereas the bits inside the error burst may or may not be erroneous. The bits outside the error burst are generally assumed to be error-free. An error burst may begin near the end of the code word and cyclically wrap-around and continue at the beginning of the code word.

In some embodiments, a component decoder corrects a burst error pattern by cyclically shifting the component code word such that the error burst falls in the location of the parity bits, re-encoding the component code word (so as to replace the error burst with newly-calculated parity), and cyclically shifting the re-encoded component code word back to the original position. When, however, the length of the error burst exceeds the burst error correction capability of the individual component decoder, the decoding fails.

In the re-encoding scheme, there is usually no indication regarding decoding failure. Moreover, if one or more errors are not located within the redundancy bits, the re-encoded data will typically contain errors, but the respective syndrome will be zero, falsely indicating an error-free code word. Thus, the super decoder should avoid applying re-encoding when the certainty of not having errors outside the error burst is low.

In some embodiments, the super decoder jointly decodes multiple component code words that share a burst error pattern using joint encoding. In an embodiment, the super decoder cyclically shifts the input of each of the component codes involved, so as to position the error burst at the location of the parity bits, and then jointly encodes the parity bits by multiplying a vector comprising the non-parity bits by a suitable matrix, which is derived from a parity check matrix of the super code. The super decoder replaces the bits of the component code words corresponding to the error burst with the jointly produced parity bits. In some embodiments, the super decoder applies the individual and joint re-encoding processes described above to the syndromes of the input bits instead of to the input bits themselves. In this case the cyclic shift operation is replaced by a multiplication by a suitable power of $\alpha$ in the respective GF, and the joint encoding operation is performed by inverting a suitable sub-matrix of the parity check matrix of the composite code.

In the disclosed techniques, joint decoding of two or more component codes enables the super-code decoder to correct a number of errors that is higher than the error correction capabilities of the individual component codes.

System Description

Figure 1:
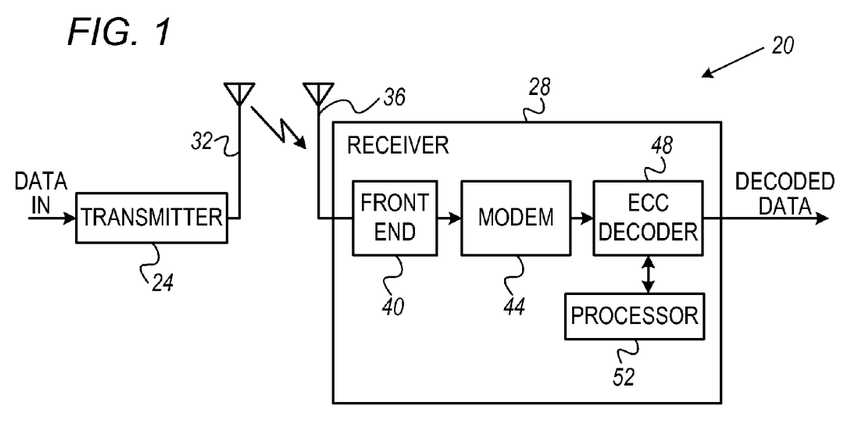
FIG. 1 is a block diagram that schematically illustrates a communication system that uses Error Correction Coding (ECC), in accordance with an embodiment that is described herein.

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC (the encoded data is also referred to as a code word), modulates the encoded data in accordance with a certain modulation scheme, converts the modulated digital signal to an analog signal, up-converts the analog signal to a suitable Radio frequency (RF), and transmits the RF signal toward the receiver using a transmitting antenna 32.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the received code word possibly containing one or more errors) is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems or optical communication systems, as well.

Figure 2:
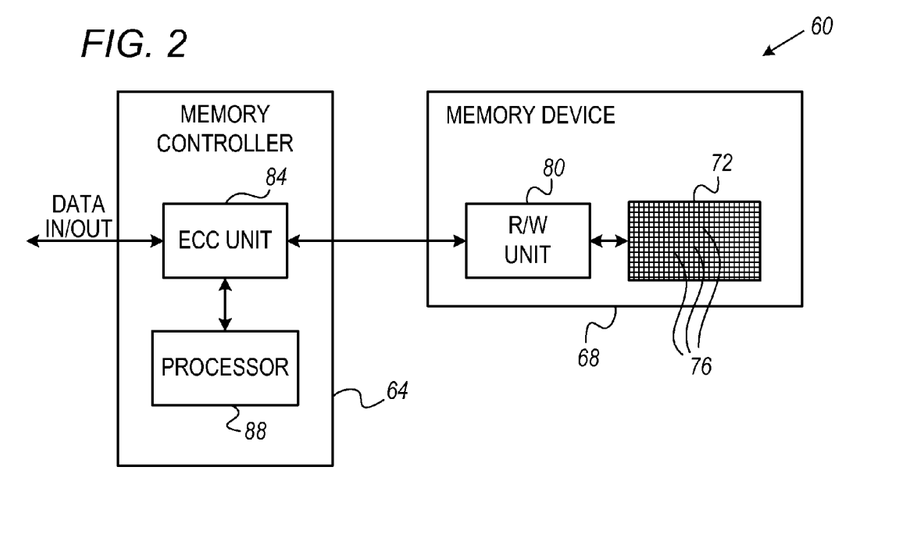
FIG. 2 is a block diagram that schematically illustrates a memory system that uses Error Correction Coding (ECC), in accordance with an embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage in accordance with a certain ECC, and decodes the ECC of data that is retrieved from the memory cells. Unit 84 is controlled by a processor 88. The structure and functionality of unit 84 are described in detail below.

In some embodiments, the ECC used in systems 20 and comprise a super-code, such as a Generalized Low Density Parity Check (GLDPC) code or any other suitable type of super-code. The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Super-Code Decoding with Joint Decoding of Underlying Component Codes

As noted above, a super-code typically comprises multiple component codes, such that a valid code word generated in accordance with the super-code (i.e., a super code word) comprises a set of valid component code words of the underlying component codes.

Super-codes are typically designed so that each of the component code words shares one or more bits with at least one other component code word of the super code word. Additionally, each bit of the super code word either belongs to a single component code word or is shared among multiple component code words. Note that a shared bit can be an information bit or a parity check bit that is encoded by multiple different component code encoders.

A decoder suitable for decoding the super code word is also referred to herein as a "super-code decoder," or simply a "super decoder" for brevity, and a decoder suitable for decoding a given component code word is referred to herein as a "component decoder."

In some embodiments, a super decoder performs an iterative process, in which the processing in each of the iterations comprises sequential (or other orderly) decoding of the individual component code words using the respective component decoders. In some embodiments, the super decoder comprises a single instance of a component decoder per each different type of component code. Alternatively, the super decoder comprises multiple instances of a given component decoder for decoding multiple component code words of the same component code.

The overall super-code decoding succeeds when the decoding of all the component codes results in valid respective component code words. Since each component code word shares one or more bits with at least one other component code word, correcting an erroneous bit in one component code word can assist in the decoding of other component code words that share this bit.

Figure 3:
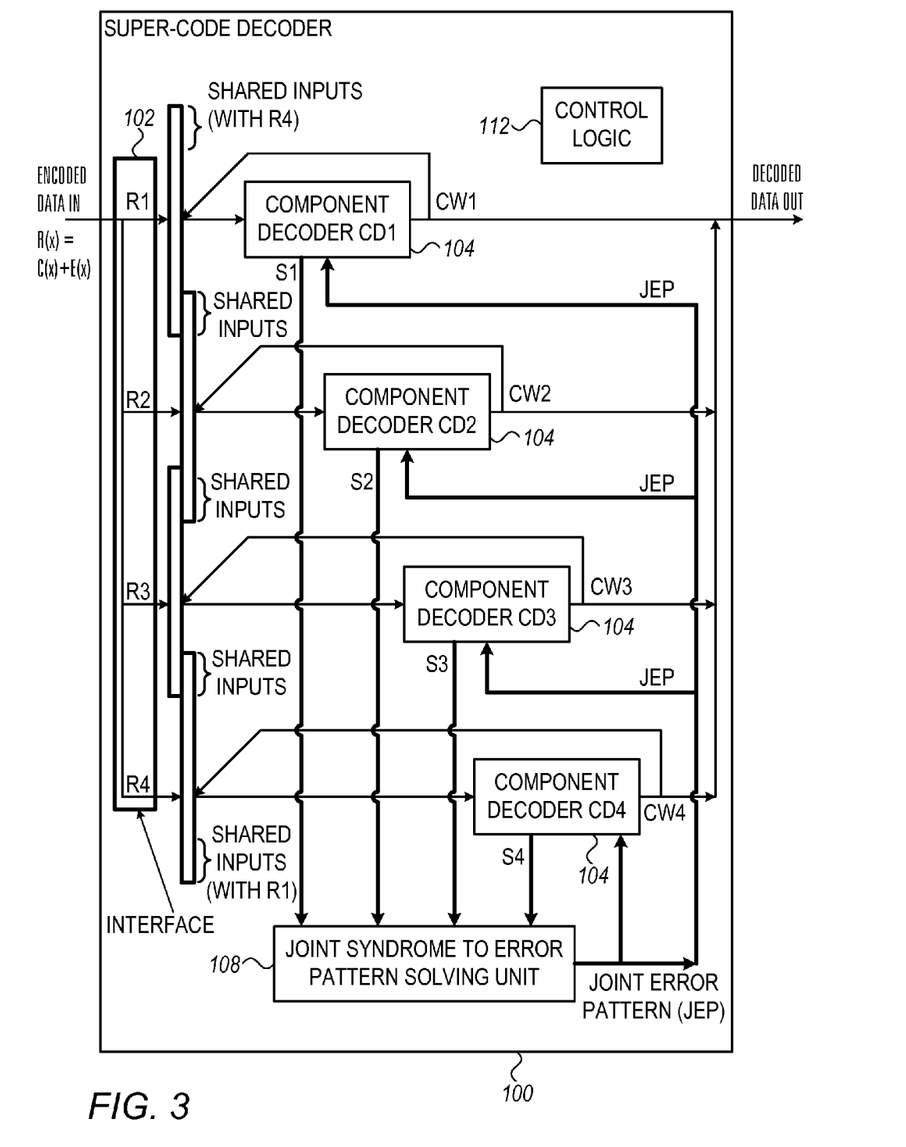
FIG. 3 is a block diagram that schematically illustrates a super-code decoder that performs joint decoding of underlying component codes, in accordance with an embodiment that is described herein.

FIG. 3 is a block diagram that schematically illustrates a super-code decoder 100 that performs joint decoding of underlying component codes, in accordance with an embodiment that is described herein. Super decoder 100 can be used, for example, for implementing ECC decoder 48 in communication system 20, or ECC unit 84 is storage system 60.

Super decoder 100 comprises multiple component decoders 104 for decoding the respective underlying component codes. In the present example, the super decoder comprises four component decoders, which are denoted CD1 . . . CD4. In the present example each of the component decoders comprises a single decoder instance that can be applied on multiple component code words of the same type. In alternative embodiments, each of component decoders 104 may comprise multiple decoding instances of the respective decoder.

In the description that follows we mainly assume that the component codes are defined over the same GF. Alternatively, the component codes can be defined over different GFs and extended to the largest GF among them. Note that such a solution may result in suboptimal usage of redundancy bits.

Super decoder 100 receives as input channel hard decisions for the bits of a given super code word. Alternatively, decoder 100 may receive channel soft information that additionally indicates reliability measures for the respective hard decisions. The channel hard decisions and/or the soft information are referred to herein as channel inputs. The polynomial representation of the input and super code word are denoted $R(x)$ and $C(x)$, respectively. When $R(x)$ equals $C(x)$ the input to super decoder 100 contains no errors. Otherwise, the input contains one or more errors, and can be written as $R(x)=C(x)+E(x)$, wherein $E(x)$ denotes a polynomial representation of the respective error pattern. For the sake of brevity and clarity, polynomial representations in the description that follows, may be written without explicit reference to the underlying variable, e.g., $R(x)$ may be written as just R.

Super decoder 100 comprises an interface 102 that splits input $R(x)$ to individual inputs R1 . . . R4 and delivers these individual inputs to respective component code decoders CD1 . . . CD4. Individual input R1 comprises a valid component code word CW1 that may contain errors, which are indicated by an error pattern E1, i.e., R1=CW1+E1. Similarly the other individual inputs are given by, R2=CW2+E2, R3=CW3+E3 and R4=CW4+E4.

In the example of FIG. 3, each of the component code words CW1 . . . CW4 shares one or more bits with two other component code words. Bits that are shared between two component code words (e.g., CW1 and CW2) are also shared between the respective inputs (e.g., R1 and R2), and interface 102 delivers such shared inputs to both respective component decoders (e.g., CD1 and CD2).

In some embodiments, super decoder 100 performs an iterative decoding process so that in every iteration super decoder 100 attempts to decode one or more of the individual component code words CW1 . . . CW4, using respective component decoders CD1 . . . CD4. The super decoder may use any suitable method for managing and scheduling the iterative decoding.

For example, in some embodiments, when the decoding of a given component decoder succeeds, the valid decoded component code word replaces the respective channel inputs. In other embodiments, only channel inputs corresponding to bits that are shared with other component code words are replaced. In yet other embodiments, the channel inputs are retained for subsequent processing. In yet alternative embodiments, the super decoder makes output hard decisions for a given component code word only after some or all of the other component code words with which it shares bits have been processed. Decoding of the super code word succeeds when all of the underlying component decoders output a respective valid component code word.

Super decoder 100 can use any suitable decoding method for implementing the component decoders. In some embodiments, decoding the component code words is based on syndrome decoding techniques. Consider, for example, a BCH code over a Galois Field $GF(2^m)$ that is defined by its generator polynomial $g(x)$ of degree m. The roots of $g(x)$ are elements of the field $GF(2^m)$. In the description that follows, referring to a code $g(x)$ means the code that is generated by the generator polynomial $g(x)$.

Consider a channel input $r(x)=c(x)+e(x)$, wherein $c(x)$ is a valid code word of the BCH code $g(x)$, and $e(x)$ denotes an error pattern. A typical syndrome decoding process includes the following phases: 1) derive a syndrome set S by evaluating the input $r(x)$ over the roots of $g(x)$, i.e., $S=\{r(\alpha)|\alpha: g(\alpha)=0\}$, 2) based on S identify $e(x)$ using algorithms such as, for example, the Berlekamp-Massey algorithm or the Peterson-Gorenstein-Zierler algorithm, and 3) recover the code word $c(x)$ by calculating $c(x)=r(x)-e(x)$. The Berlekamp-Massey and Peterson-Gorenstein-Zierler algorithms are described, for example, in chapters 9.6 and 12.9 of "The Theory of Error Correcting Codes," North-Holland Publishing Company, 1977, pp. 270-277 and 365-368, respectively, whose disclosures are incorporated herein by reference.

The error correction capability of a given component code refers to the guaranteed maximum number of errors that the code can correct. Thus, when the number of errors exceeds the error correction capability, decoding is likely to fail. In some embodiments, when recognizing that all the bit errors in two or more component code words occur in the bits that are shared among these component code words, the super decoder jointly decodes these code words, which results in improved error correction capability, as will be described in detail below.

Joint decoding differs from iterative decoding in several aspects. For example, in iterative decoding, the processing of one component code word should rely on previously generated code words in order to overcome decoding failures in previous iterations. In joint decoding, on the other hand, two or more component code words may be processed simultaneously with no reference to other successfully decoded component code words, in order to successfully overcome individual decoding failures. Moreover, in iterative decoding the super decoder typically processes the component code words sequentially, whereas in joint decoding the super decoder processes two or more component code words simultaneously.

As another example, in iterative decoding, the processing of a given component code word depends only on channel inputs for the bits of this component code word. In joint decoding, on the other hand, the decoding of a given component code word additionally depends on channel inputs of at least one other component code word that are not shared with the given component code word.

Joint decoding of multiple component codes enables the super decoder to correct a number of errors that is larger than the error correction capability of each of the individual component codes. In an embodiment, super decoder 100 applies joint syndrome decoding, as will be described below. Alternatively, super decoder 100 can apply any other suitable joint decoding method.

Super decoder 100 comprises a joint syndrome to error pattern solving unit 108, which accepts syndrome sets S1 . . . S4 from the respective component decoders CD1 . . . CD4. When the entire error pattern lies in a group of shared bits, unit 108 uses the union set of two or more respective syndrome sets to generate a joint error pattern JEP. For example, if the error pattern is nonzero only for inputs shared between R1 and R2, unit 108 derives JEP from the union syndrome set of S1 and S2. In this example, component decoders CD1 and CD2 use the joint error pattern derived by unit 108 to correct the errors, instead of using the internal error patterns that are derived from S1 and S2, individually.

Super-code decoder 100 further comprises control logic 112, which handles the various tasks of super decoder 100. For example, control logic 112 manages the iterative decoding process and schedules the decoding order of the individual component decoders. Control logic 112 additionally identifies situations in which an error pattern occurs only in a group of shared bits among multiple component code words, and activates unit 108 to jointly decode the respective component code words.

The super-code decoder configuration in FIG. 3 is given by way of example, and other suitable super-code decoder configuration can also be used. For example, in FIG. 3, unit 108 accepts from component decoders 104 respective syndrome sets, and returns to the component decoders a joint error pattern. In alternative embodiments, unit 108 may receive the inputs R1 . . . R4, and apply the correction step (i.e., R−JEP) internally, instead of returning the joint error pattern to the component decoders. Further alternatively, unit 108 may derive the syndrome sets internally, instead of receiving the syndromes from the component decoders.

ECC decoder 48 of FIG. 1, ECC unit 84 of FIG. 2 and super-code decoder 100 of FIG. 3 may be implemented in software, in hardware, or using a combination of hardware and software elements. In some embodiments, decoder 48, unit 84 and/or super decoder 100 comprises one or more processors capable of executing software for carrying out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or super decoder 100 (including interface 102, component decoders 104, unit 108, and control logic 112) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

In the context of the description that follows and in the claims, all the elements of super-code decoder 100 that are not part of interface 102 are collectively referred to as decoding circuitry. The decoding circuitry thus comprises at least component decoders 104, joint syndrome to error pattern solving unit 108, and control logic 112.

Joint Syndrome Decoding

The minimal distance $d_{min}$ of a given BCH code over $GF(2^m)$ may be related to the number of roots of its generator polynomial $g(x)$ that form a sequence of consecutive powers of $\alpha$, wherein $\alpha$ is a primitive element of $GF(2^m)$. Thus, if $\alpha^i$, $\alpha^{i+1}$, . . . , $\alpha^{i+\delta}$ are all roots of $g(x)$, the minimal distance of the code $g(x)$ is equal to or greater than $\delta+2$. Note that codes that have longer sequences of consecutive powers of $\alpha$ as roots have higher minimal distances, and therefore can correct a larger number of errors.

As noted above, some types of BCH-like codes can correct multiple errors even though the roots of their generator polynomial do not form a sequence of consecutive powers of $\alpha$. The disclosed techniques apply to such codes as well.

Consider now two code words CW1 and CW2, that were encoded using different polynomial generators $g1(x)$ and $g2(x)$ of respective BCH codes over a Galois Field $GF(2^m)$. In addition, assume that R1 and R2 denote respective erroneous versions of CW1 and CW2 that share the same error pattern JEP, i.e., R1=CW1+JEP and R2=CW2+JEP. When decoding CW1 and CW2 separately, the respective syndromes sets S1 and S2, are given by $S1=\{R1(\alpha)=JEP(\alpha)|\alpha: g1(\alpha)=0\}$ and $S2=\{R2(\alpha)=JEP(\alpha)|\alpha: g2(\alpha)=0\}$.

Note that in a union set S3 that includes the syndromes of both S1 and S2, each syndrome corresponds to a root of g1($x$), g2($x$) or both. In other words, the union set S3 can be viewed as a syndrome set of a third BCH code whose generator polynomial g3($x$) is given by g3($x$)=LCM[g1($x$)·g2($x$)], wherein LCM denotes the Least Common Multiple operator.

In some embodiments, g1($x$) and g2($x$) are designed such that roots for which the syndromes in the union set are calculated, form a sequence of consecutive powers of $\alpha$. For example, designing g1($x$) with roots $\{\alpha^i, \alpha^{i+1}, \ldots, \alpha^\delta\}$ and g2($x$) with roots $\{\alpha^{i+\delta+1}, \alpha^{i+\delta+2}, \ldots \alpha^{i+\delta+\gamma}\}$ results in a code g3($x$)=g1($x$)·g2($x$) that has $\delta+\gamma+1$ consecutive powers of $\alpha$ as roots. Consequently, the guaranteed minimal distance of the code generated by g3($x$) is equal to or greater than the sum of the guaranteed minimal distances of the individual codes, i.e., $d3_{min} \geq d1_{min} + d2_{min}$. Thus, if the individual codes can correct up to T1 and T2 errors, respectively, a joint decoding can correct a number of errors T3≥T1+T2.

Note that for achieving a longer sequence of consecutive (positive) powers of $\alpha$ as roots in the union set, it is sufficient that only one of the generator polynomials has $\alpha^0$ as a root.

An embodiment in which the roots of one generator polynomial comprise reciprocals of the roots of the other generator polynomial is described below. Joint syndrome decoding in such an embodiment essentially doubles the guaranteed number of correctable errors compared to separate decoding.

Figure 4:
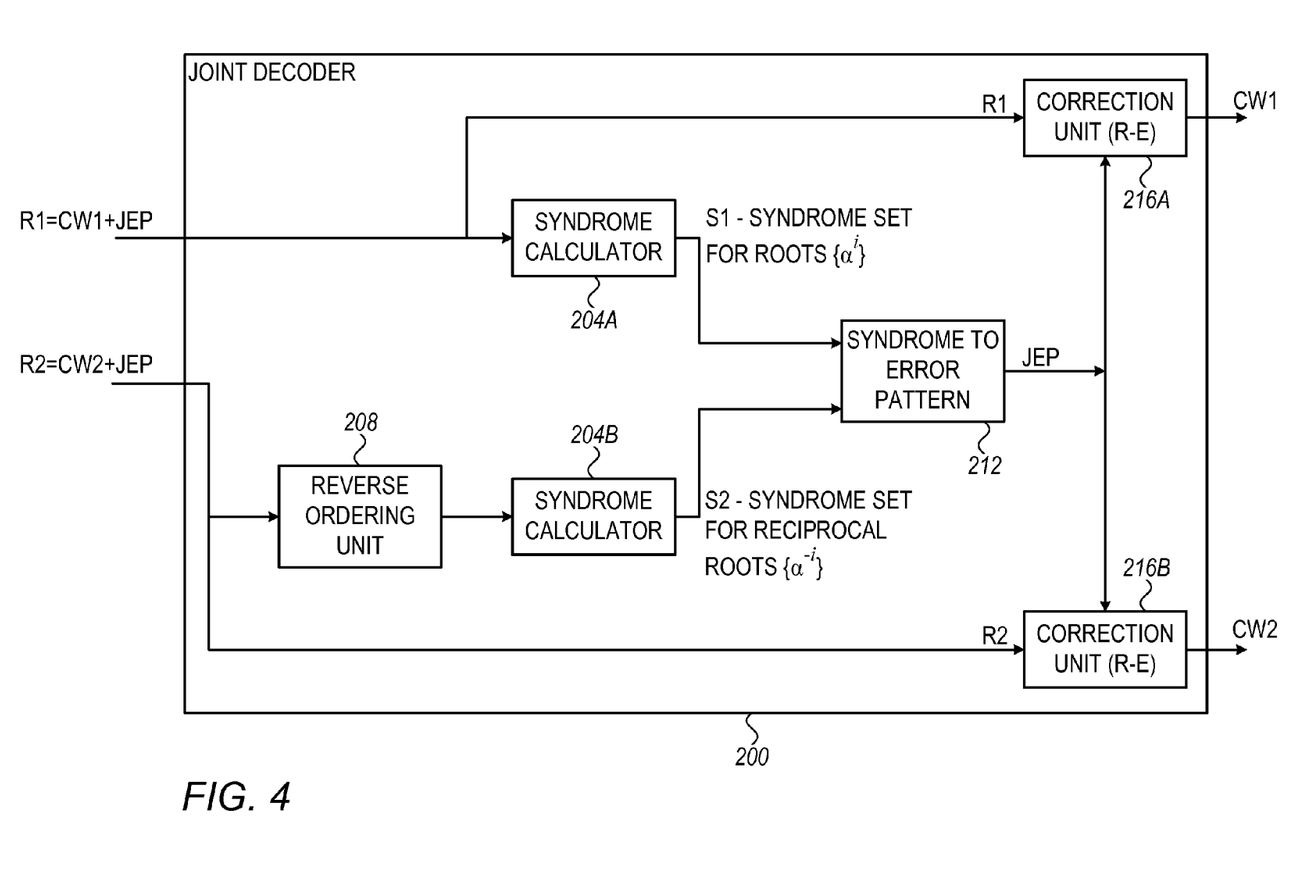
FIG. 4 is a block diagram that schematically illustrates a decoder implementing joint syndrome decoding, in accordance with an embodiment that is described herein.

FIG. 4 is a block diagram that schematically illustrates a decoder 200 implementing joint syndrome decoding, in accordance with an embodiment that is described herein. Decoder 200 (also referred to herein as a joint decoder) can be used, for example, to implement joint decoding in super decoder 100 of FIG. 3 above.

Decoder 200 receives as input hard decisions R1 and R2 for the bits of respective code words CW1 and CW2 that were encoded using respective different generator polynomials g1($x$) and g2($x$) as described above, i.e., the inputs can be written as R1=CW1+JEP and R2=CW2+JEP. In the present example the generator polynomials are designed such that g2($x$)=g1($x^{-1}$), i.e., the roots of g2($x$) are the reciprocals of the roots of g1($x$).

Joint decoder 200 comprises two syndrome calculators 204. Syndrome calculator 204A receives input R1 and calculates syndromes for the roots of the generator polynomial g1($x$). Syndrome calculator 204B receives input R2 after reversing the bit ordering using a reverse ordering unit 208, and therefore calculates syndromes for the roots of g2($x$), which are reciprocals of the roots of g1($x$), as described above. In an embodiment, unit 208 comprises a cyclic shifter (not shown) that is used for aligning the bit-reversed data with the respective powers of a. A syndrome to error pattern unit 212 receives the two sets of syndromes from syndrome calculators 204 and derives from the union set of syndromes a joint error pattern JEP. Correction units 216A and 216B recover CW1 and CW2 by calculating R1−JEP and R2−JEP, respectively.

In some embodiments, the roots in syndrome calculator 204A and the reciprocal roots in syndrome calculator 204B, form a sequence of consecutive powers of a whose length is about twice the length of the sequences of consecutive powers of $\alpha$ corresponding to the individual codes. Thus, if $\{\alpha^0, \alpha^1, \ldots, \alpha^\delta\}$ are all roots of g1($x$), and $\{\alpha^0, \alpha^{-1}, \ldots, \alpha^{-\delta}\}$ are all roots of g2($x$), decoding using the syndromes from both sets of roots is equivalent to performing syndrome decoding of a code g3($x$) whose roots are given by $\{\alpha^{-\delta}, \ldots, \alpha^0, \ldots, \alpha^\delta\}$. As a result, the number of roots of g3($x$) that form a sequence of consecutive powers of $\alpha$ is given by 2$\delta$+1. Compared to $\delta$+1 roots of consecutive powers of $\alpha$ in the individual codes, the code g3($x$) can correct about twice the number of errors compared to g1($x$) and g2($x$).

The joint decoding configuration in FIG. 4 is given by way of example, and in alternative embodiments any other suitable joint decoding configuration can also be used. For example, instead of using unit 208 for reversing the bit ordering of input R2, unit 208 can be omitted, in which case syndrome calculator 204B is configured to derive the syndromes for the reciprocal roots explicitly.

As another example, in some embodiments, the codes g1($x$) and g2($x$) can be designed so that the union set of roots from both codes forms a sequence of consecutive powers of $\alpha$, even though the roots of g2($x$) are not reciprocals of the roots of g1($x$). Additionally, in some embodiments, decoder 200 is configured to perform joint decoding to more than two codes.

Examples of Practical Super Codes

A super-code comprising two generator polynomials having reciprocal roots is described, for example, in section I.9.2.1 of the ITU-T Recommendations G.975.1, entitled "SERIES G: TRANSMISSION SYSTEMS AND MEDIA, DIGITAL SYSTEMS AND NETWORKS; Digital sections and digital line system—Optical fibre submarine cable systems; Forward error correction for high bit-rate DWDM submarine systems," February, 2004, which is incorporated herein by reference. The G.975.1 recommendations define horizontal and sloping BCH(1020,988) codes having the following generator polynomials:

$$g_H(x) = m_1(x) m_3(x) m_5(x) (x^2+1) \qquad \text{Equation 1:}$$

$$g_S(x) = x^{30} m_1(x^{-1}) m_3(x^{-1}) m_5(x^{-1}) (x^2+x+1) \qquad \text{Equation 2:}$$

The definition of polynomials m1, m2, and m3 is given in recommendation G.975.1 cited above. The roots of $g_H(x)$ and $g_S(x)$ contain the following cyclotomic cosets:

$$\{\alpha | g_H(\alpha) = 0\} \supseteq \{\alpha^0, (\alpha)^{2^l}, (\alpha^3)^{2^l}, (\alpha^5)^{2^l}\} \qquad \text{Equation 3:}$$

$$\{\alpha | g_S(\alpha) = 0\} \supseteq \{(\alpha^{-5})^{2^l}, (\alpha^{-3})^{2^l}, (\alpha^{-1})^{2^l}\} \qquad \text{Equation 4:}$$

As seen in Equations 3 and 4, the roots of $g_S(x)$ are reciprocals of the roots of $g_H(x)$. Consequently, estimating a joint error pattern using the syndromes of both codes is equivalent to decoding a code for which the roots of the generator polynomial belong to the set given in Equation 5 below. Assuming that the horizontal and sloping codes can each correct up to T errors, the joint decoding, as described above, results in error correction capability of 2T errors.

$$\{(\alpha^{-5})^{2^l}, (\alpha^{-3})^{2^l}, (\alpha^{-1})^{2^l}, \alpha^0, (\alpha)^{2^l}, (\alpha^3)^{2^l}, (\alpha^5)^{2^l}\} \qquad \text{Equation 5:}$$

Consider, for example, a frame that was encoded in accordance with the generating polynomials given in section I.9.2.1 of the ITU-T Recommendations G.975.1 cited above. When a horizontal code word and a sloping code word in the frame contain a number of errors that exceeds the error correction capability (e.g., up to T errors) of the individual horizontal and sloping codes, the decoding of the frame fails. If, however, the error pattern is shared between the two code words and includes no more than 2T errors, the two code words can be successfully decoded jointly, using, for example, decoder 200 of FIG. 4, above.

The ITU-T Recommendations G.975.1 cited above, as well as the code defined by the generator polynomials $g_H(x)$ and $g_S(x)$ of section I.9.2.1 thereof, were given by way of example. In alternative embodiments, any other suitable codes and related generator polynomials for which the disclosed techniques are applicable can also be used. For example, other pairs of generator polynomials for the component codes whose roots are reciprocal roots of one another can also be used.

Consider now another example of joint decoding of two BCH codes. Table 1 below describes the assignment of bits to the two codes.

TABLE 1

Assigning input bits to two BCH decoders

| bit  | 0-100 | 101 | 102 | 103 | 104 | 105 | ... 106 |
|------|-------|-----|-----|-----|-----|-----|---------|
| BCH1 | x     |     | x   |     | x   |     | X       |
| BCH2 | x     | x   |     | x   |     | X   |         |

As seen in Table 1, bits in the range 0-100 are encoded by both codes, even bits above 100 are assigned only to code BCH1 and odd bits above 100 only to code BCH2. When receiving an input that contains errors only in bits 0-100, joint decoding of the BCH1 and BCH2 can be applied as described herein.

The syndrome generated by a sequence $c(x)+e(x)$, where $c(x)$ is a valid code word and $e(x)$ is an error pattern, equals the syndrome generated by the error pattern $e(x)$ alone. If the error pattern appears entirely within the shared bits 0-100, the respective syndrome is equal to a syndrome corresponding to a $c'(x)$ in which all the bits except those in the error locations are zero. Since the value of all the bits above 100 equals '0', we may assume that these bits are shared by both the codes BCH1 and BCH2, as these bits do not contribute to the value of the syndrome.

Thus, assuming that each of the codes BCH1 and BCH2 can correct up to T errors, using joint syndrome decoding such as, for example as described in FIG. 4 above, results in error correction capability of up to 2T errors in the bit-range 0-100.

Figure 5:
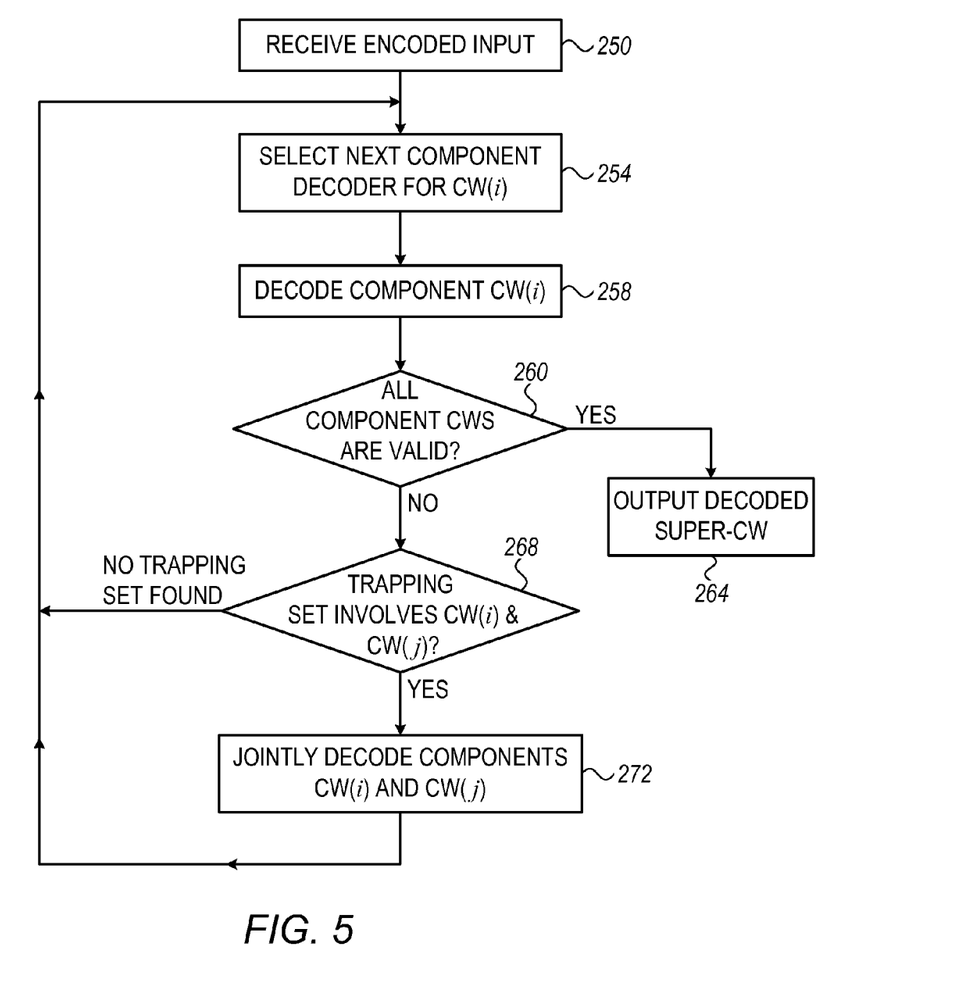
FIG. 5 is a flow chart that schematically illustrates a method for super-code decoding, in accordance with an embodiment that is described herein.

FIG. 5 is a flow chart that schematically illustrates a method for super-code decoding, in accordance with an embodiment that is described herein. The method can be executed, for example, by super decoder 100 of FIG. 3 above. Control and scheduling operations of the method are executed by control logic 112. The method begins by super decoder 100 receiving encoded input via interface 102, at a receiving step 250. The received input comprises a valid super code word that comprises multiple valid component code words CW(i). The super code word (and therefore at least one component code word) possibly contains one or more errors.

Interface 102 splits the received input to individual inputs to be processed by component decoders 104. At a selection step 254, super decoder 100 selects a component decoder for decoding a component code word CW(i). At an individual decoding step 258, the selected component decoder attempts to decode CW(i), i.e., as part of an iterative decoding process. Decoder 100 can select component decoders at step 254 using any suitable order, such as, for example, sequential selection.

At a termination checking step 260, decoder 100 checks whether all the component decoders have succeeded to decode a valid code word. If the result at step 260 is positive, decoder 100 outputs the decoded component code words as the decoded super code word, at an output step 264, and the method terminates. When at step 260 the decoder finds that at least one of the component codes has failed to decode a valid code word, the decoder proceeds to a trapping set checking step 268, in which decoder 100 checks for a trapping set condition.

When at step 268 the super decoder identifies no trapping sets, the super decoder loops back to step 254 to select another component decoder. When at step 268 the decoder identifies a trapping set that involves component code words CW(i) and CW(j), it is assumed that the only uncorrected bits in these component code words belong to both of them. The decoder then attempts to resolve the trapping set by jointly decoding CW(i) and CW(j), at a joint decoding step 272, for example using joint syndrome decoding methods as described above. Following step 272 the method loops back to step 254 to select another component decoder.

At step 272 above it was assumed that only the component code words CW(i) and CW(j) have not been successfully decoded, and are therefore jointly decoded. When such an assumption is uncertain, the joint decoder can solve a partial set of the union set of syndromes, and then verify the correctness of this joint decoding by checking the syndromes that were excluded from the joint decoding. Note that using a partial set of the syndromes for joint deciding may reduce the error correction capability.

The decoding configuration described in the method of FIG. 5 is given by way of example, and any other suitable decoding configuration can also be used. For example, in an alternative embodiment, instead of checking the state of the component decoders at step 260 after each decoding operation (at step 258), the super decoder may apply step 260 only once per iteration, after attempting to decode all the component codes.

Joint Decoding for Improved Burst Error Correction

In some embodiments, the component codes of the super-code comprise cyclic codes, such as, for example, BCH codes. Assuming that the $i^{th}$ component code comprises a $(n_i, k_i)$ cyclic code, individual decoding of each component code can correct burst error patterns of length $n_i - k_i$ bits, or less.

In an embodiment, to individually decode an input that comprises a burst error pattern that starts at a given bit-position, the component decoder erases up to n-k bits at this known position, cyclically shifts the erased bits to the location of the parity bits, re-encodes, and cyclically shifts the resulting code word so that the newly-calculated parity bits replace the bits of the error burst. In an embodiment, the component decoder finds the starting bit-position of the error burst by analyzing the syndromes corresponding to the component code.

As will be described below, when the error burst is shared among multiple component code words, the parity bits for replacing the error burst can be calculated jointly.

Consider a parity check matrix H corresponding to a super-code that comprises multiple cyclic component codes. For the sake of clarity, assume that the super code word, which is denoted SC, comprises a redundancy part P and a non-redundancy part (data part) C, i.e., SC=[C P]. Alternatively, the data and parity parts may be interleaved with one another. The parity part P comprises the redundancy bits generated in accordance with the underlying component codes of the super-code. Let H=[H1 H2] denote a decomposition of H, in which the sub-matrix H2 serves for checking the redundancy part P. Then, the following matrix equation holds: [H1·C]+[H2·P]=[0]. Solving the equation for the redundancy bits P we get:

$$P = -H2^{-1} \cdot [H1 \cdot C] = [-H2^{-1} \cdot H1] \cdot [C] = [HS] \cdot [C] \qquad \text{Equation 6:}$$

As will be described below, solving Equation 6 serves, in some embodiments, for joint decoding of burst error patterns.

In an embodiment, matrix HS is calculated offline and stored, and the super decoder solves Equation 6 on-line as a function of [C]. In practice, Equation 6 needs to be solved only for a sub-matrix of HS that corresponds to the parity bits of the component code words sharing the burst error pattern. For example, when using identical component codes, it is sufficient to store a sub-matrix of HS that is suitable for all the pairs (or other groups) of the component codes.

In some embodiments, each of the component codes is generated using a respective generator polynomial, wherein each of these generator polynomials has a respective different set of roots. In such embodiments, the equations corresponding to the redundancy bits of different component codes are linearly independent, and therefore H2 in equation 6 is invertible. Note that using different sets of roots is a sufficient condition for having a unique solution to Equation 6. The joint encoding operation can be viewed as an encoding operation of a single code whose generator polynomial's set of roots comprises the union of the root sets of the generator polynomials of the component codes.

We now describe an example method for joint decoding of error burst patterns. Consider multiple component codes that share a burst error pattern, wherein the $i^{th}$ component code generates Pi redundancy bits. The method can be executed, for example, by unit 108 of super decoder 100 of FIG. 3 above. The method comprises the following main steps:

1. Align the groups of shared bits for all the involved component codes, e.g., by cyclically shifting the bits of each component code word so that the shared bits are aligned (with corresponding powers of the roots of the generating polynomial) among the involved component code words, e.g., as the redundancy bits.
2. Using the shifted component code words, evaluate a joint set of syndromes, which includes a union set of the syndrome sets of the individual component codes.
3. Evaluate the position of the error burst within the group of shared bits using the joint set of syndromes.
4. Shift the error burst to the position of the redundancy bits (this may be needed when the size of the group of shared bits exceeds the error burst correction capability).
5. Perform joint re-encoding using, for example Equation 6 above.
6. Cyclically shift each component code word back to its original position.

Note that steps 3-6 above provide an example method for error burst correction. In alternative embodiments, any other suitable methods for correcting burst error patterns can also be used. For example, in one embodiment, instead of shifting and re-encoding, the super decoder evaluates the error pattern from the union syndrome set of step 2 above, and uses the evaluated error pattern for correcting the error burst.

In some embodiments, instead of cyclically shifting the code words and then evaluating the syndromes (as in steps 1 and 2 above), the syndromes corresponding to the (un-shifted) code words are shifted by multiplying each syndrome by suitable power of $\alpha$. The power depends on the root which generates the syndrome and on the required shift.

In the method described above, step 5 is applicable only if the trapping set is contained within a contiguous set of bits that is not longer than the joint error burst capability (which is determined by the unique roots corresponding to the multi-plication of the generating polynomials involved). Otherwise, the trapping set may be solved by inverting (e.g., on-line when necessary) a sub-matrix, which comprises the columns of H that participate solely in the groups of shared bits. This on-line inverted sub-matrix replaces $H2^{-1}$ in Equation 6 above, in which case P represents the bits that are suspected to contain the error burst. In cases in which this (on-line) inverted sub-matrix is not a full-rank matrix, the errors are uncorrectable and the decoding fails.

Consider, for example, applying the joint burst error decoding methods described above to a frame that was encoded in accordance with the generating polynomials $g_H(x)$ and $g_S(x)$ of the code given in section I.9.2.1 of the ITU-T Recommendations G.975.1, cited above. The disclosed techniques, however, are not limited to this code and related polynomials $g_H(x)$ and $g_S(x)$, and are generally applicable to any other code and generator polynomials, such as, for example a code whose component code words overlap in more than three bits.

In the example frame using the generating polynomials given in code of section I.9.2.1 of the ITU-T Recommendations G.975.1, cited above, when a horizontal code word and a sloping code word in the frame contain a burst error pattern that exceeds the burst error correction capability (e.g., up to a length P burst error pattern) of the individual horizontal and sloping codes, the decoding of the frame fails. If, however, the error pattern is shared between the two code words and comprises a burst error pattern not longer than 2P, the two code words can be successfully decoded jointly, using, for example, the methods for joint error burst decoding described above.

More generally, when the error pattern falls entirely in a group of bits that is shared among Z component code words, wherein each respective component code can correct burst error patterns of length P or less, and additionally each of the Z component codes has a different set of roots, so that there are Z·P linearly independent syndromes, the disclosed techniques enable the super decoder to correct burst error patterns of length up to Z·P.

Although in the embodiments described above we mainly refer to BCH component codes, the disclosed techniques are also applicable to other types of component codes, such as, for example Reed-Solomon (RS) codes.

Although the description above mainly refers to binary codes, the disclosed techniques are also applicable to non-binary codes such as, for example, RS codes.

Although the description above mainly refers to hard decoding of the component codes, soft decoding techniques are also applicable. For example, soft decoding using, for example, the Chase algorithm, can be applied only to the bits that are shared among multiple component code words, benefiting from the increased minimal distance of the emulated code, as described above.

Although the embodiments described herein mainly address improved decoding of super-codes, the methods and systems described herein can also be used in other applications, such as in decoding cyclic codes such as BCH codes.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for decoding, comprising:
   in a decoder, receiving channel inputs for respective bits of a super code word that comprises at least first and second component code words having a shared group of bits;
   iteratively decoding, by the decoder, the at least first and second component code words; and
   in response to recognizing by the decoder that the first and second component code words contain errors only within the shared group of bits, the decoder jointly decoding the first and second component code words.

2. The method according to claim 1, wherein jointly decoding the first and second component code words comprises decoding the first component code word using one or more of the channel inputs of respective bits of the second component code word that are outside the shared group of bits.

3. The method according to claim 1, wherein jointly decoding the first and second component code words comprises decoding the second component code word independently of a successful decoding outcome of decoding the first component code word.

4. The method according to claim 1, wherein iteratively decoding the first and second component code words comprises correcting up to first and second numbers of bit errors in the channel inputs for the respective first and second component code words, and wherein jointly decoding the first and second component code words comprises correcting up to a number of errors that is larger than the first and second numbers individually.

5. The method according to claim 1, wherein jointly decoding the first and second component code words comprises evaluating first and second syndrome sets for decoding the respective first and second component code words, and deriving an error pattern using a syndrome set that comprises at least one syndrome from each of the first and second syndrome sets.

6. The method according to claim 5, wherein the first and second component code words were produced using respective first and second generator polynomials having roots in a given Galois Field (GF), wherein the first and second syndrome sets correspond to first and second sets of roots of the respective first and second generator polynomials, such that a union of the first and second sets of roots comprises a sequence of consecutive powers of a primitive element of the given GF.

7. The method according to claim 6, wherein one or more of the roots of the second generator polynomial comprises a reciprocal of a respective root of the first generator polynomial.

8. The method according to claim 6, wherein evaluating the second syndrome set comprises reversing a bit order of the channel inputs for the respective bits of the second component code word.

9. The method according to claim 1, wherein the errors contained only within the shared group of bits comprise a burst error pattern, wherein jointly decoding the first and second component code words comprises jointly encoding redundancy bits for the respective first and second component code words, and replacing bits in the first and second component code words corresponding to the burst error pattern with the jointly encoded redundancy bits.

10. The method according to claim 9, wherein jointly encoding the redundancy bits comprises multiplying a vector that comprises non-redundancy bits of the first and second component code words by a matrix that is derived from a parity check matrix of the super-code.

11. The method according to claim 9, wherein jointly encoding the redundancy bits comprises evaluating a joint set of syndromes that includes at least one syndrome corresponding to each of the first and second code words, multiplying each of the evaluated syndromes by a respective power of a primitive element of an underlying GF, and evaluating a position of an error burst within the shared group of bits based on the joint set of syndromes.

12. The method according to claim 9, wherein jointly encoding the redundancy bits comprises cyclically shifting the shared group of bits within each of the first and second component code words so as to align positions of the shared group of bits in the first and second component code words, evaluating a joint set of syndromes that includes at least one syndrome corresponding to each of the first and second code words, and evaluating a position of an error burst within the shared group of bits based on the joint set of syndromes.

13. The method according to claim 12, wherein jointly encoding the redundancy bits comprises cyclically shifting the error burst from the evaluated position to a position of respective redundancy bits of the first and second code words, jointly re-encoding the first and second code words, and cyclically shifting the re-encoded bits in the first and second code words to their original respective positions.

14. The method according to claim 9, wherein jointly decoding the component code words comprises evaluating a joint set of syndromes that includes at least one syndrome corresponding to each of the first and second code words, and evaluating an error pattern using the joint syndrome set.

15. A decoder, comprising:
   an interface configured to receive channel inputs for respective bits of a super code word that comprises at least first and second component code words having a shared group of bits; and
   decoding circuitry configured to process the channel inputs so as to iteratively decode the at least first and second component code words, and, in response to recognizing that the first and second component code words contain errors only within the shared group of bits, to jointly decode the first and second component code words.

16. The decoder according to claim 15, wherein the decoding circuitry is configured to decode the second component code word independently of a decoding outcome of decoding the first component code word.

17. The decoder according to claim 15, wherein the decoding circuitry is configured to evaluate first and second syndrome sets for decoding the respective first and second component code words, and to derive an error pattern using a syndrome set that comprises at least one syndrome from each of the first and second syndrome sets.

18. The decoder according to claim 17, wherein the first and second component code words were produced using respective first and second generator polynomials having roots in a given Galois Field (GF), and wherein the first and second syndrome sets correspond to first and second sets of roots of the respective first and second generator polynomials, such that a union of the first and second sets of roots comprises a sequence of consecutive powers of a primitive element of the given GF.

19. The decoder according to claim 15, wherein the errors contained only within the shared group of bits comprise a burst error pattern, and wherein the decoding circuitry is configured to jointly encode redundancy bits for the respective first and second component code words, and to replace bits of the first and second code words corresponding to the burst error pattern with the jointly encoded redundancy bits.

20. The decoder according to claim 15, wherein the decoding circuitry is configured to jointly encode the redundancy bits by multiplying a vector that comprises non-redundancy bits of the first and second component code words by a matrix that is derived from a parity check matrix of the super-code.

* * * * *